US012598765B2

(12) United States Patent
Lu et al.

(10) Patent No.: US 12,598,765 B2
(45) Date of Patent: Apr. 7, 2026

(54) TRANSISTOR WITH LOW LEAKAGE CURRENTS AND MANUFACTURING METHOD THEREOF

(71) Applicants: Etron Technology, Inc., Hsinchu (TW); Invention And Collaboration Laboratory Pte. Ltd., Singapore (SG)

(72) Inventors: Chao-Chun Lu, Taipei City (TW); Weng-Dah Ken, Hsinchu City (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 0 days.

(21) Appl. No.: 18/639,993

(22) Filed: Apr. 19, 2024

(65) Prior Publication Data

US 2024/0266438 A1 Aug. 8, 2024

Related U.S. Application Data

(62) Division of application No. 16/885,210, filed on May 27, 2020, now Pat. No. 11,990,548.

(60) Provisional application No. 62/853,175, filed on May 28, 2019.

(51) Int. Cl.
*H01L 29/78* (2006.01)
*H10D 30/01* (2025.01)
*H10D 30/62* (2025.01)
*H10D 62/13* (2025.01)
(Continued)

(52) U.S. Cl.
CPC .......... *H10D 30/62* (2025.01); *H10D 30/024* (2025.01); *H10D 30/6219* (2025.01); *H10D*

*62/151* (2025.01); *H10D 64/021* (2025.01); *H10D 64/258* (2025.01)

(58) Field of Classification Search
CPC .. H10D 30/62; H10D 30/024; H10D 30/6219; H10D 62/151; H10D 64/021; H10D 64/258; H10D 30/0221; H10D 30/60; H10D 62/021; H10D 30/0275; H10D 62/116; H10D 64/516; H10D 62/112; H10D 64/015; H10D 64/018; H10D 84/0147;
(Continued)

(56) References Cited

U.S. PATENT DOCUMENTS

| | | | |
|---|---|---|---|
| 7,019,363 | B1 | 3/2006 | Yu |
| 2005/0133881 | A1 | 6/2005 | Oh |
| 2009/0149012 | A1 | 6/2009 | Brask |

(Continued)

FOREIGN PATENT DOCUMENTS

| | | |
|---|---|---|
| CN | 1437269 A | 8/2003 |
| CN | 1606173 | 4/2005 |

(Continued)

*Primary Examiner* — Cuong B Nguyen
(74) *Attorney, Agent, or Firm* — Winston Hsu

(57) ABSTRACT

A transistor with low leakage currents includes a substrate, a gate, spacers, pad dielectric layers, a source, and a drain. The gate is formed above a gate dielectric layer, wherein the gate dielectric layer has a first dielectric constant. The spacers have a second dielectric constant. The pad dielectric layers are formed under the spacers and having a third dielectric constant. The source and the drain are adjacent to the spacers and in two opposite directions of the gate. The first dielectric constant, the second dielectric constant, and the third dielectric constant are different from each other.

6 Claims, 7 Drawing Sheets

(51) Int. Cl.
    *H10D 64/01*        (2025.01)
    *H10D 64/23*        (2025.01)
(58) Field of Classification Search
    CPC ........... H10D 30/0285; H10D 30/0293; H10D
                                                      84/0184
    See application file for complete search history.

(56)                 References Cited

U.S. PATENT DOCUMENTS

| | | | |
|---|---|---|---|
| 2016/0218180 A1* | 7/2016 | You | ................... H10D 30/0243 |
| 2017/0373148 A1 | 12/2017 | Cheng | |
| 2019/0006517 A1 | 1/2019 | Liang | |
| 2019/0140064 A1 | 5/2019 | Bi | |
| 2019/0334004 A1 | 10/2019 | Bi | |
| 2020/0058561 A1 | 2/2020 | Liao | |
| 2020/0350436 A1 | 11/2020 | Wang | |

FOREIGN PATENT DOCUMENTS

| | | |
|---|---|---|
| CN | 106373997 A | 2/2017 |
| KR | 10-2005-0061883 A | 6/2005 |
| KR | 10-2016-0025435 A | 3/2016 |
| TW | I662604 B | 6/2019 |
| TW | I707391 B | 10/2020 |
| WO | 2006/029956 A1 | 3/2006 |
| WO | 2018/182570 A1 | 10/2018 |

* cited by examiner

TRANSISTOR WITH LOW LEAKAGE CURRENTS AND MANUFACTURING METHOD THEREOF

CROSS REFERENCE TO RELATED APPLICATIONS

This application is a division of U.S. application Ser. No. 16/885,210, filed on May 27, 2020, which claims the benefit of U.S. Provisional Application No. 62/853,175, filed on May 28, 2019. The contents of these applications are incorporated herein by reference.

BACKGROUND OF THE INVENTION

1. Field of the Invention

The present invention relates to a transistor and a manufacturing method thereof, and particularly to a transistor with low leakage currents and a manufacturing method thereof.

2. Description of the Prior Art

Systems based on germanium (Ge) or silicon (Si) semiconductor technology have become smaller and require low power consumption for various applications. The most competitive device technology that can meet the above-mentioned requirements is CMOS (Complementary Metal Oxide Semiconductor) FinFET (fin field-Effect transistor) device technology. On the other hand, the biggest problem is the so-called short channel effect including gate-induced drain leakage (GIDL) or band-to-band (BTB) tunneling leakage current and source/drain to substrate leakage at elevated operating temperature environments. Conventional CMOS devices are primarily fabricated using bulk germanium or Si substrates. MOS devices fabricated on bulk germanium or Si substrates have characteristics that are sensitive to manufacturing conditions when length of a gate of a MOS device is reduced to less than 30 to 40 nm. Moreover, performance of a CMOS device having a channel length of about 30 nm is not sufficient to be realized in an actual high performance circuit like mobile computing or 5G (fifth generation wireless systems) network communications.

Since spacer regions formed on both sides of a gate of a MOS are not scaled down by conventional FinFET device skills, there is only a small margin to increase the integration density by reducing the actual area occupied by a single device at the risk of taller and brittle fin-like active regions.

A number of studies have been published on analysis of characteristics of conventional FinFET device structures, including on Silicon On Insulator (SOI) substrates instead of bulk substrates, however, the parasitic resistivity of the source/drain regions due to film thickness becomes too large and thus requires a substantially uniform selective epitaxial (SEG) layer is grown in the source/drain regions. The further scale-down characteristics of conventional FinFET device structures are not much improved without having new inventions to realize low GIDL and junction leakage currents while achieving further scaling down its dimension and boosting up its performance.

As the physical channel length of CMOS shrinks down 20 nm or 10 nm and beyond, the MOS device facing the problem of suppressing short channel effect becomes more important and more difficult than ever.

In this regard, FinFET becomes the current technology selection due to its superiority of the most attractive device structure, channel charge controllability and high driving current performances, etc. The characteristics of traditional MOSFET or FinFET transistors, in particular, bulk-junction tri-/dual-gate FinFETs have advantages of bulk substrate Heat dissipation, wafer cost and defect density compared with SOI FinFET or other type device structures. However, the considerable GIDL or junction leakages deteriorate in the various FinFET structures; in particular, such GIDL or Junction leakage current has the significant negative impacts on its standby power consumption, active power dissipations with higher TCO (Total-Cost of Ownerships) and deviating from the prevailing Green-ecosystem requirements. In particular, among those applications, such as Mobile, IoT (Internet of Things), AI (Artificial Intelligence), and 5G communications, are demanding lesser and lesser on its standby power consumption and active power dissipations.

When the technology of FinFET shrinking down to about 20 nm, GIDL and junction leakages are characterized to be the fundamental scaling limits by either physical limits or structural restraints. Therefore, how to reduce GIDL and junction leakages for future MOSFET device's further scaling down to sub-10 nm scales has become an important issue.

SUMMARY OF THE INVENTION

The present invention provides a transistor with low leakage currents, such as planar transistor, Finfet (fin field-Effect transistor), GAA (gate-all-around) transistor, or other Fin-shape transistor. In one embodiment, the transistor is a FinFET which includes a substrate, a gate, spacers, pad dielectric layers, a source, and a drain. The gate is formed above a gate dielectric layer, wherein the gate dielectric layer has a first dielectric constant. The spacers have a second dielectric constant. The pad dielectric layers are formed under the spacers and having a third dielectric constant. The source and the drain are formed in the substrate, wherein the source and the drain are adjacent to the spacers and installed in two opposite directions of the gate. The first dielectric constant, the second dielectric constant, and the third dielectric constant are different from each other.

According to an aspect of the invention, the gate dielectric layer is formed above a Fin-like active region, the Fin-like active region is formed above a surface of the substrate, the Fin-like active region includes a semiconductor material, and the pad dielectric layers are formed between the spacer and the Fin-like active region.

According to another aspect of the invention, the source and the drain are formed in a first concave of the substrate and a second concave of the substrate respectively and coupled to the Fin-like active region, and top surfaces of the source and the drain are higher than a top surface of the Fin-like active region.

According to another aspect of the invention, a bottom of at least one concave of the first concave and the second concave is filled with an isolator, and an isolator-substrate junction exists between the isolator and the substrate.

According to another aspect of the invention, the transistor further includes a first contact and a second contact. The first contact is formed above the source, wherein a first distance exists between the first contact and a corresponding spacer of the spacers; and the second contact is formed above the drain, wherein a second distance exists between the second contact and another corresponding spacer of the spacers; wherein the second distance is larger than the first distance; wherein top surfaces of the first contact and the second contact are higher 5 nm to 400 nm than the top surface of the fin-like active region.

It is known that the MOSFET source/drain junction doping is formed by either ion-implantation, epitaxial doping or atomic layer deposition (ALD) doping methods, etc. The source and drain doping concentration is typically graduated distribution due to thermal or random doping diffusion effects and cannot be forming two different doping profiles within the same source or drain regions. According to another aspect of the invention, at least one of the source and the drain has a controllable doping concentration distribution by taking a controllable doping method including at least two or more different doping levels (i.e. doping recipes) during the source/drain formation periods of time, and a distribution direction of the controllable doping concentration distribution is vertical or horizontal.

According to another aspect of the invention, the controllable doping concentration distribution includes a first doping concentration and a second doping concentration, the first doping concentration corresponds to a first region of the at least one and the second doping concentration corresponds to a second region of the at least one, the second doping concentration is between $10^{17}$ atom/cm$^3$ to $10^{21}$ atom/cm$^3$ and the first doping concentration is two times or more times higher than the second doping concentration, and a first resistivity of the first region is lower than a second resistivity of the second region.

According to another aspect of the invention, besides of that the gate dielectric layer is formed between the gate and the fin-like active region, the gate dielectric layer is further located at between the gate and the spacers.

According to another aspect of the invention, the gate dielectric layer is formed between the gate and the fin-like active region, and further between the gate and the spacers, wherein at least one of the pad dielectric layers has multiple thicknesses.

According to another aspect of the invention, the fin-like active region is a channel of the transistor.

According to another aspect of the invention, the gate has sidewalls directly coupled to one or more of the spacers, and the gate dielectric layer has a rounded shape at edge sides between the gate and the spacers, wherein an outer curvature radius of the rounded shape is greater than a thickness of the gate dielectric layer.

According to another aspect of the invention, the first dielectric constant is greater than the second dielectric constant, and the second dielectric constant is greater than the third dielectric constant.

According to another aspect of the invention, a thickness of each pad dielectric layer is less than a thickness of each spacer of the spacers.

According to another aspect of the invention, the gate is comprised of a p+ or n+ doped polysilicon containing material, or a metal containing material.

According to another aspect of the invention, a thickness of at least one spacer of the spacers is controllable, a dimension of the source is controllable, and a dimension of the drain is controllable wherein the dimension of the source is different from the dimension of the drain.

According to another aspect of the invention, a thickness of each pad dielectric layer of the pad dielectric layers is between 1 nm to 15 nm.

According to another aspect of the invention, the third dielectric constant (i.e. relative permittivity) is between 1 and 4.

Another embodiment of the present invention provides a transistor. The transistor includes a substrate, a gate, a first region, and a second region. The substrate includes a surface. The gate is formed above a gate dielectric layer. The first region is coupled to one side of the gate, the first region includes a first spacer, a first pad dielectric layer under the first spacer, and a first conductive region. The second region is coupled to another side of the gate, the second region includes a second spacer, a second pad dielectric layer under the second spacer, and a second conductive region. The first region and the second region are asymmetric.

According to another aspect of the invention, the first conductive region at least extends downward from the surface, and the second conductive region at least extends downward from the surface.

According to another aspect of the invention, the first region further includes an isolator abutting to the first conductive region and being positioned under the first conductive region.

According to another aspect of the invention, the first spacer and the second spacer are asymmetric.

According to another aspect of the invention, the transistor is a FinFET transistor, and the first conductive region and the second conductive region are asymmetric.

Another embodiment of the present invention provides a manufacturing method for a transistor. The manufacturing method includes preparing a substrate with a surface; forming a gate dielectric layer above the surface; forming a gate of the transistor above the gate dielectric layer; and forming a first region coupled to one side of the gate and a second region coupled to another side of the gate; wherein the first region and the second region are asymmetric.

According to another aspect of the invention, forming the first region includes forming a first spacer coupled to the one side of the gate and a first conductive region, and forming the second region includes forming a second spacer coupled to the another side of the gate and a second conductive region, wherein the first conductive region or the second conductive region has included recipes to forming a controllable doping concentration distribution, and forming a distribution direction of the controllable doping concentration distribution, wherein the distribution direction is vertical or horizontal.

The present invention provides a Fin Field-effect transistor (FinFET). Because the FinFET utilizes at least one of different dielectric layers, controllable doping concentration of a source and a drain of the FinFET, different gate dielectric layers, different junctions of the source and the drain, different thickness of the source and the drain, and different dimensions of the source and the drain to reduce gate-induced drain leakage (GIDL) leakage current, SCE (short-channel effect), OFF current, or junction leakage current, compared to the prior art, the present invention can reduce the GIDL leakage current, SCE, OFF current, or junction leakage current more effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
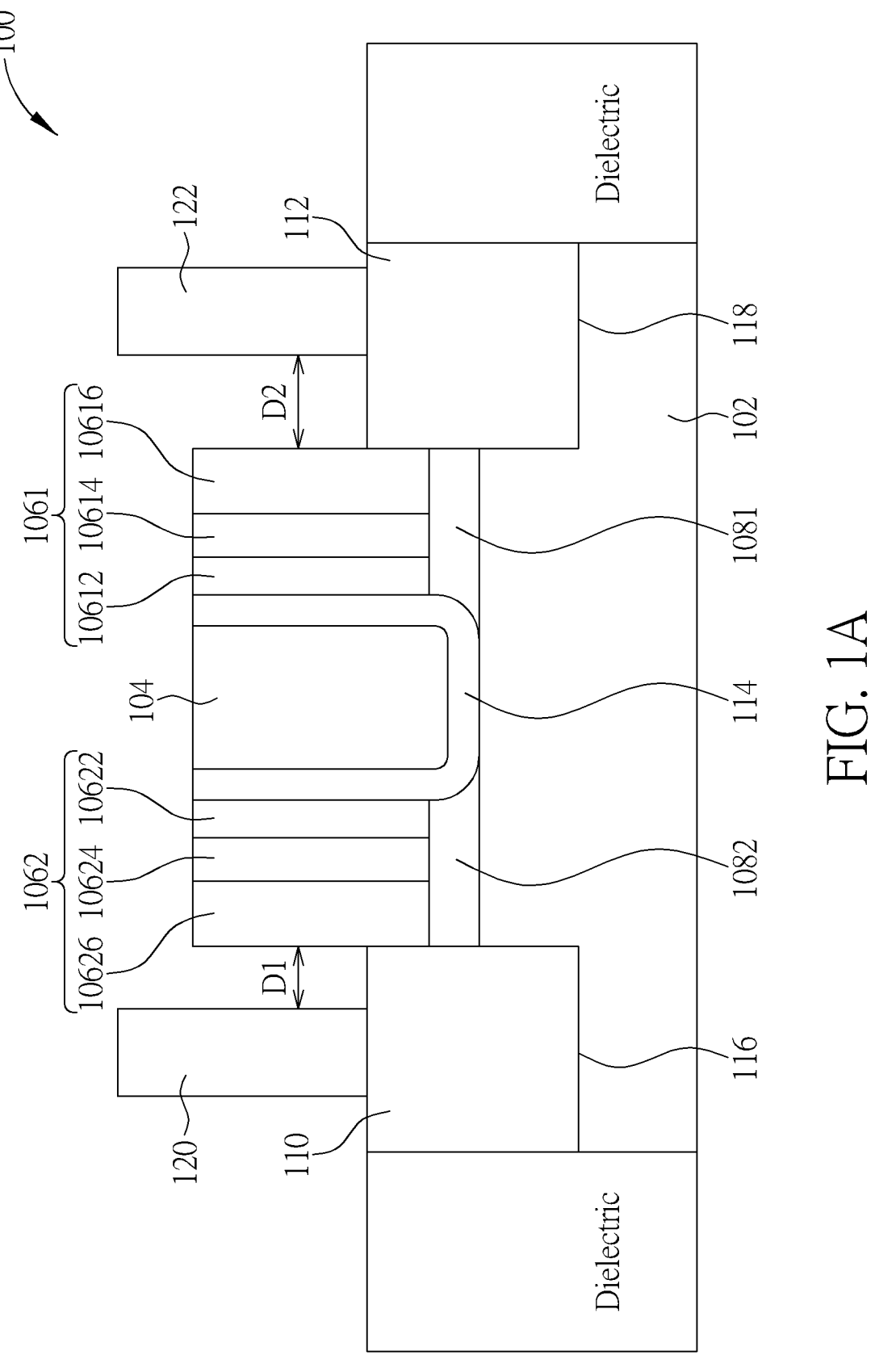
FIG. 1A is a diagram illustrating a cross section of a fin field-Effect transistor according to a first embodiment of the present invention.

The present invention provides a transistor with low leakage currents, such as planar transistor, Finfet (fin field-Effect transistor), GAA (gate-all-around)transistor, or other Fin-shape transistor. The following description uses a fin field-Effect transistor as example. Please refer to FIG. 1A. FIG. 1A is a diagram illustrating a cross section of a fin field-Effect transistor (FinFET) 100 according to a first embodiment of the present invention, wherein the FinFET 100 includes a substrate 102, a gate 104, spacers 1061, 1062, pad dielectric layers 1081, 1082, a source 110, and a drain 112, and the substrate 102 is a p-type substrate. Each spacer of the spacers 1061, 1062 can include a multi-layer structure (e.g. the each spacer can include a three-layer structure. That is, the spacer 1061 can be composed of an oxide layer 10612, a nitride layer 10614, and an oxide layer 10616, and the spacer 1062 can be composed of an oxide layer 10622, a nitride layer 10624, and an oxide layer 10626. Of course, the spacers 1061, 1062 are not limited to including the three-layer structure, that is, the spacers 1061, 1062 can include a two-layer structure or other multiple-layer structures. In addition, as shown in FIG. 1A, a first region includes the spacer 1062, the pad dielectric layer 1082 under the spacer 1062, and the source 110 (i.e. a first conductive region) and the first region is coupled to one side of the gate 104; similarly, a second region includes the spacer 1061, the pad dielectric layer 1081 under the spacer 1061, and the drain 112 (i.e. a second conductive region) and the second region is coupled to another side of the gate 104.

The gate 104 is formed above a gate dielectric layer 114, the gate dielectric layer 114 is further between the gate 104 and the spacers 1061, 1062, and the pad dielectric layers 1081, 1082 are formed under the spacers 1061, 1062 and between the spacers 1061, 1062 and a fin-like active region, the source 110 and the drain 112 are formed in a first concave 116 of the substrate 102 and a second concave 118 of the substrate 102 respectively, wherein the source 110 and the drain 112 are adjacent to the spacers 1061, 1062 and in two opposite directions of the gate 104, top surfaces of the source 110 and the drain 112 are higher than a top surface of the Fin-like active region, a source-substrate junction exists between the source 110 and the substrate 102, a drain-substrate junction exists between the drain 112 and the substrate 102, and the fin-like active region is a channel of the FinFET 100.

In addition, the gate dielectric layer 114 has a first dielectric constant, the spacers 1061, 1062 have a second dielectric constant, and the pad dielectric layers 1081, 1082 have a third dielectric constant. In addition, because the FinFET 100 includes a fin structure which is well-known to one of ordinary skill in the art, one of ordinary skill in the art should be realize the gate dielectric layer 114 is formed above the Fin-like active region (not shown in FIG. LA), the Fin-like active region is formed above a surface of the substrate 102, the source 110 and the drain 112 are coupled to the Fin-like active region, and the pad dielectric layers 1082, 1081 are further formed between the spacers 1061, 1062 and the Fin-like active region. In addition, the Fin-like active region includes a semiconductor material (e.g. the Fin-like active region can include a monocrystalline silicon material, compound semiconductor material or a polysilicon material).

As shown in FIG. 1A, the FinFET 100 further includes a first contact 120 and a second contact 122, the first contact 120 is formed above the source 110, and the second contact 122 is formed above the drain 112, wherein a first distance D1 exists between the first contact 120 and the spacer 1062, a second distance D2 exists between the second contact 122 and the spacer 1061, and the second distance D2 is larger than the first distance D1. In addition, top surfaces of the first contact 120 and the second contact 122 are higher 5 nm to 400 nm than a top surface of the fin-like active region.

Because the pad dielectric layers 1081, 1082 are formed under the spacers 1061, 1062 and between the spacers 1081, 1082 and the Fin-like active region, the first dielectric constant is greater than the second dielectric constant and the second dielectric constant is greater than the third dielectric constant, and a thickness of each pad dielectric layer of the pad dielectric layers 1081, 1082 is greater or less than a thickness of the gate dielectric layer 114, the pad dielectric layers 1081, 1082 can sustain for higher E potential drop and reduce E-field strength at the top surface of the fin-like active region, wherein the E-field reduction can reduce band-to-band (BTB) tunneling leakage current at the top surface of the fin-like active region so as to achieve very low gate-induced drain leakage (GIDL) or very low OFF current while further scaling down a dimension of the channel of the FinFET 100. That is, the FinFET 100 utilizes the pad dielectric layers 1081, 1082 with lower dielectric constant and the selected thickness of the pad dielectric layers 1081, 1082 to suppress effectively tip-discharging leakage current of the top surface of the fin-like active region and semiconductor BTB E-field induced GIDL leakage currents.

In addition, a thickness of each pad dielectric layer of the pad dielectric layers 1081, 1082 is between 1 nm to 15 nm and less than a thickness of each spacer of the spacers 1061, 1062, the third dielectric constant is between 1 and 4, and the gate 104 is comprised of a p+ or n+ doped polysilicon containing material or a metal containing material.

In addition, because the top surfaces of the first contact 120 and the second contact 122 are higher 5 nm to 400 nm than the top surface of the fin-like active region, Gate-to-drain overlap region is increased, resulting in the GIDL leakage current, SCE (short-channel effect), OFF current, or junction leakage current being reduced and making the FinFET 100 further scaling down possible.

Figure 1B:
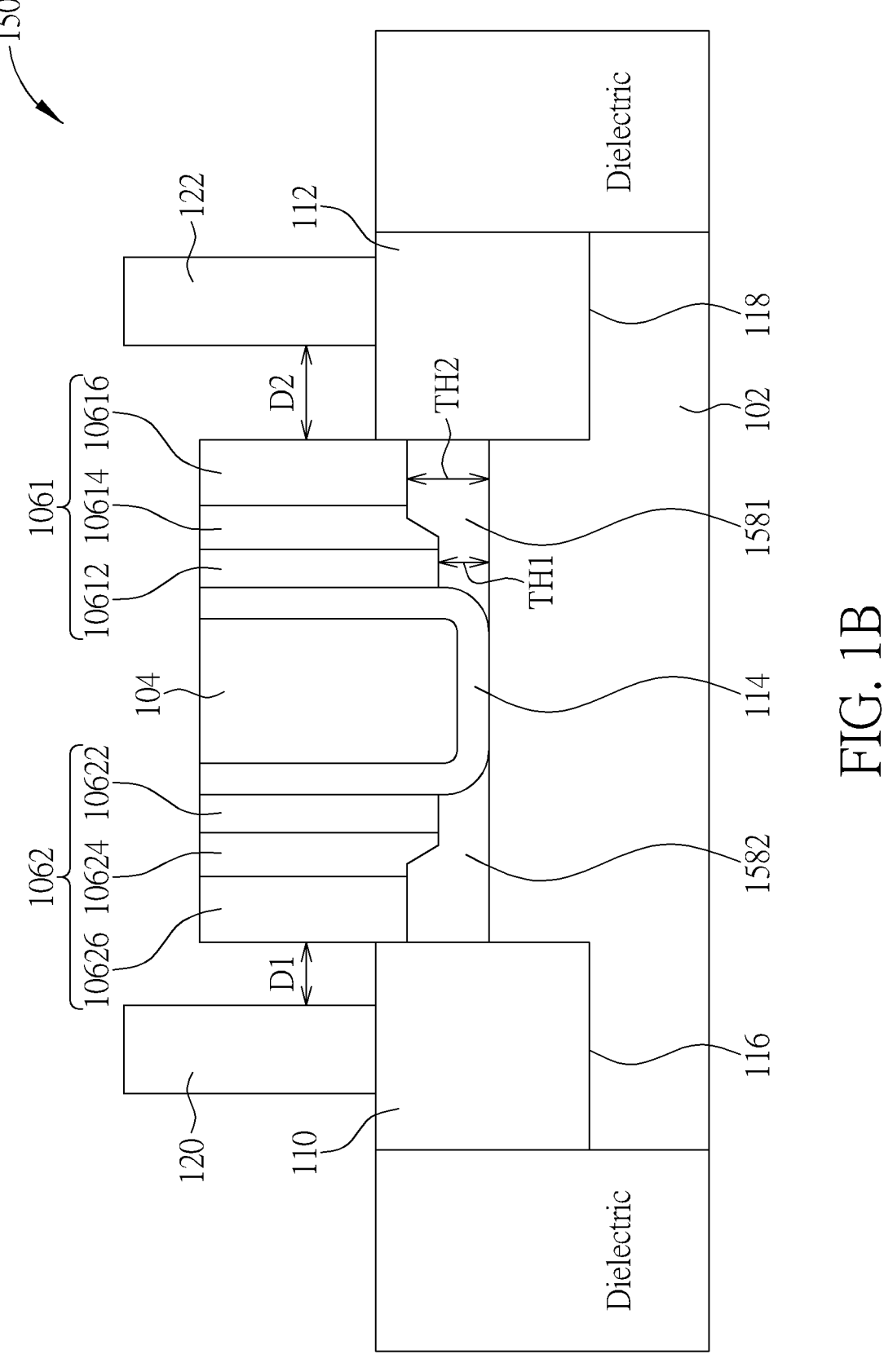
FIG. 1B is a diagram illustrating a cross section of a fin field-Effect transistor according to another embodiment of the present invention.

Please refer to FIG. 1B. FIG. 1B is a diagram illustrating a cross section of a fin field-Effect transistor (FinFET) 150 according to another embodiment of the present invention, wherein a difference between the FinFET 150 and the FinFET 100 is that each pad dielectric layer of pad dielectric layers 1581, 1582 has multiple thicknesses. For example, as shown in FIG. 1B, the pad dielectric layers 1581 includes a first area with a thickness TH1 and a second area with a thickness TH2, wherein the thickness TH1 is less than the thickness TH2, and the second area with the thickness TH2 can further reduce the GIDL leakage current. In addition, the present invention is not limited to both of the pad dielectric layers 1581, 1582 having multiple thicknesses. That is, in another embodiment of the present invention, at least one of the pad dielectric layers 1581, 1582 has multiple thicknesses. In addition, subsequent operational principles of the FinFET 150 can be referred to operational principles of the FinFET 100, so further description thereof is omitted for simplicity.

Figure 2:
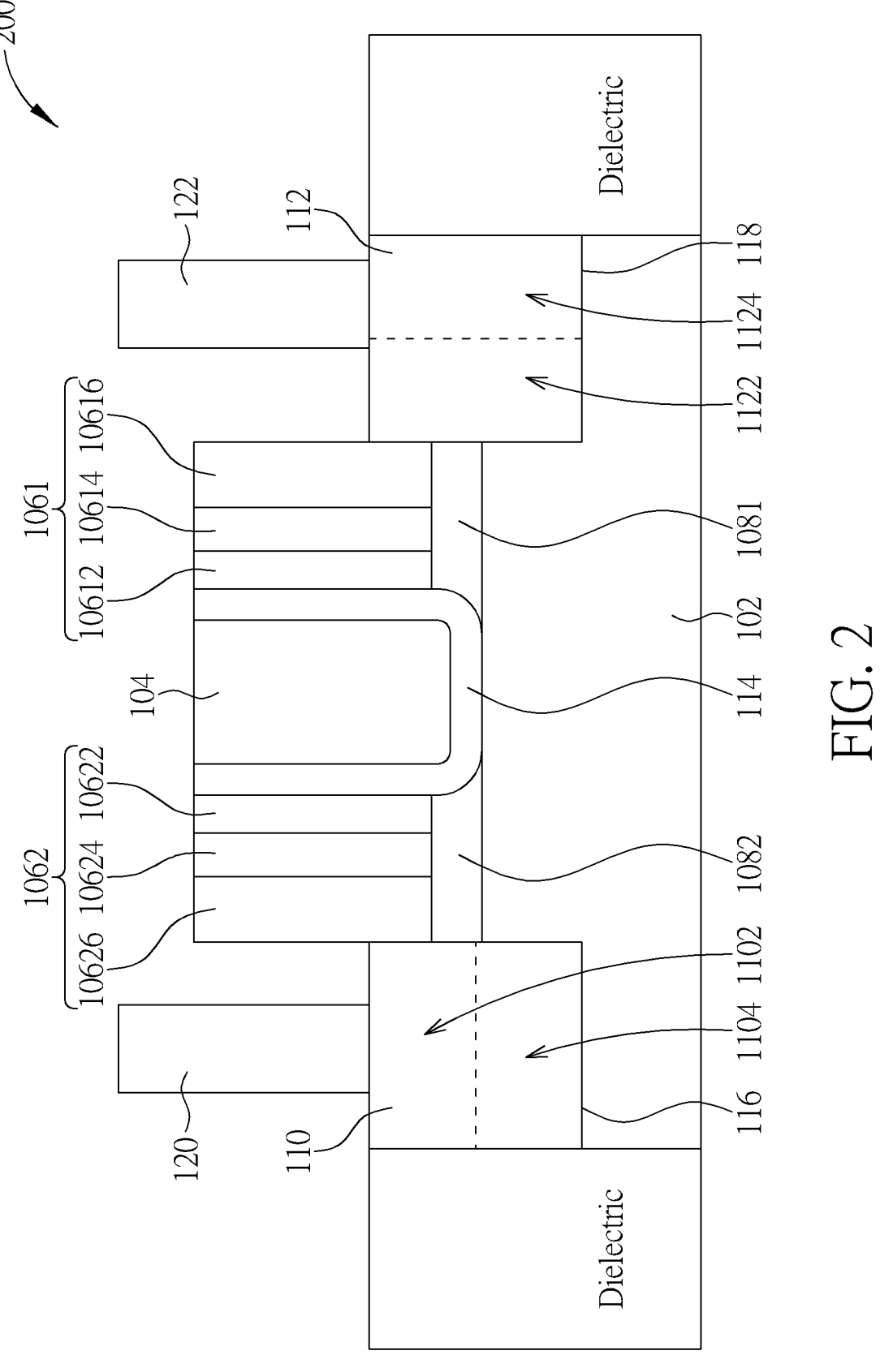
FIG. 2 is a diagram illustrating a cross section of a FinFET according to a second embodiment of the present invention.

Please refer to FIG. 2. FIG. 2 is a diagram illustrating a cross section of a FinFET 200 according to a second embodiment of the present invention, wherein differences between the FinFET 200 and the FinFET 100 are that at least one of the source 110 and the drain 112 has a controllable doping concentration distribution, and a distribution direction of the controllable doping concentration distribution is vertical or horizontal. For example, the source 110 has a first controllable doping concentration distribution and the drain 112 has a second controllable doping concentration distribution, wherein a distribution direction of the first controllable doping concentration distribution is vertical, and a distribution direction of the second controllable doping concentration distribution is horizontal.

In addition, by taking a controllable doping method including at least two or more different doping levels (i.e. doping recipes) during the source/drain formation periods of time, the first controllable doping concentration distribution includes a first doping concentration and a second doping concentration, the first doping concentration corresponds to a first region 1102 of the source 110 and the second doping concentration corresponds to a second region 1104 of the source 110, the second doping concentration is between $10^{17}$ atom/cm$^3$ to $10^{21}$ atom/cm$^3$ and the first doping concentration is two times or more times higher than the second doping concentration, and a first resistivity of the first region 1102 is lower than a second resistivity of the second region 1104; the second controllable doping concentration distribution also includes the first doping concentration and the second doping concentration, the first doping concentration corresponds to a third region 1124 of the drain 112 and the second doping concentration corresponds to a fourth region 1122 of the drain 112, and a third resistivity of the third region 1124 is lower than a fourth resistivity of the fourth region 1122 such that the SCE or GIDL effects of the FinFET 100 can be reduced while making a good Ohmic contact in source or drain contacts. Then, the skill can help with getting higher semiconductor manufacturing yield while reducing its cost.

In addition, in one embodiment of the present invention, the source 110 and the drain 112 can be forming by different ion-implantation doping concentration (that is, the first controllable doping concentration distribution and the second controllable doping concentration distribution) or selective epitaxiy growth with different doping, wherein the first controllable doping concentration distribution and the second controllable doping concentration distribution are intentionally controlled.

As shown in FIG. 2, because the source 110 has the first controllable doping concentration distribution and the drain 112 has the second controllable doping concentration distribution, junction electric field between the first region 1102 and the second region 1104 and junction electric field between the third region 1124 and the fourth region 1122 can be reduced to form multiple-serial resistivity between the fin-like active region and the first contact 120 and between the fin-like active region and the second contact 122, resulting in the GIDL leakage current, the SCE (short-channel effect), the OFF current, or the junction leakage current being reduced. That is, the FinFET 200 can relief effectively the E-field and potential gradient at the top surface of the fin-like active region nearby the source 110 and the drain 112 so as to reduce the GIDL leakage current, the SCE (short-channel effect), the OFF current, or the junction leakage current by selecting doping levels of the first doping concentration and the second doping concentration or taking a controllable doping method including at least two or more different doping levels (i.e. doping recipes) during the source/drain formation periods of time.

In addition, the present invention is not limited to the distribution direction of the first controllable doping concentration distribution being vertical, and the distribution direction of the second controllable doping concentration distribution being horizontal. That is, in another embodiment of the present invention, both the distribution direction of the first controllable doping concentration distribution and the distribution direction of the second controllable doping concentration distribution are vertical or horizontal. In addition, subsequent operational principles of the FinFET 200 can be referred to operational principles of the FinFET 100, so further description thereof is omitted for simplicity.

Figure 3:
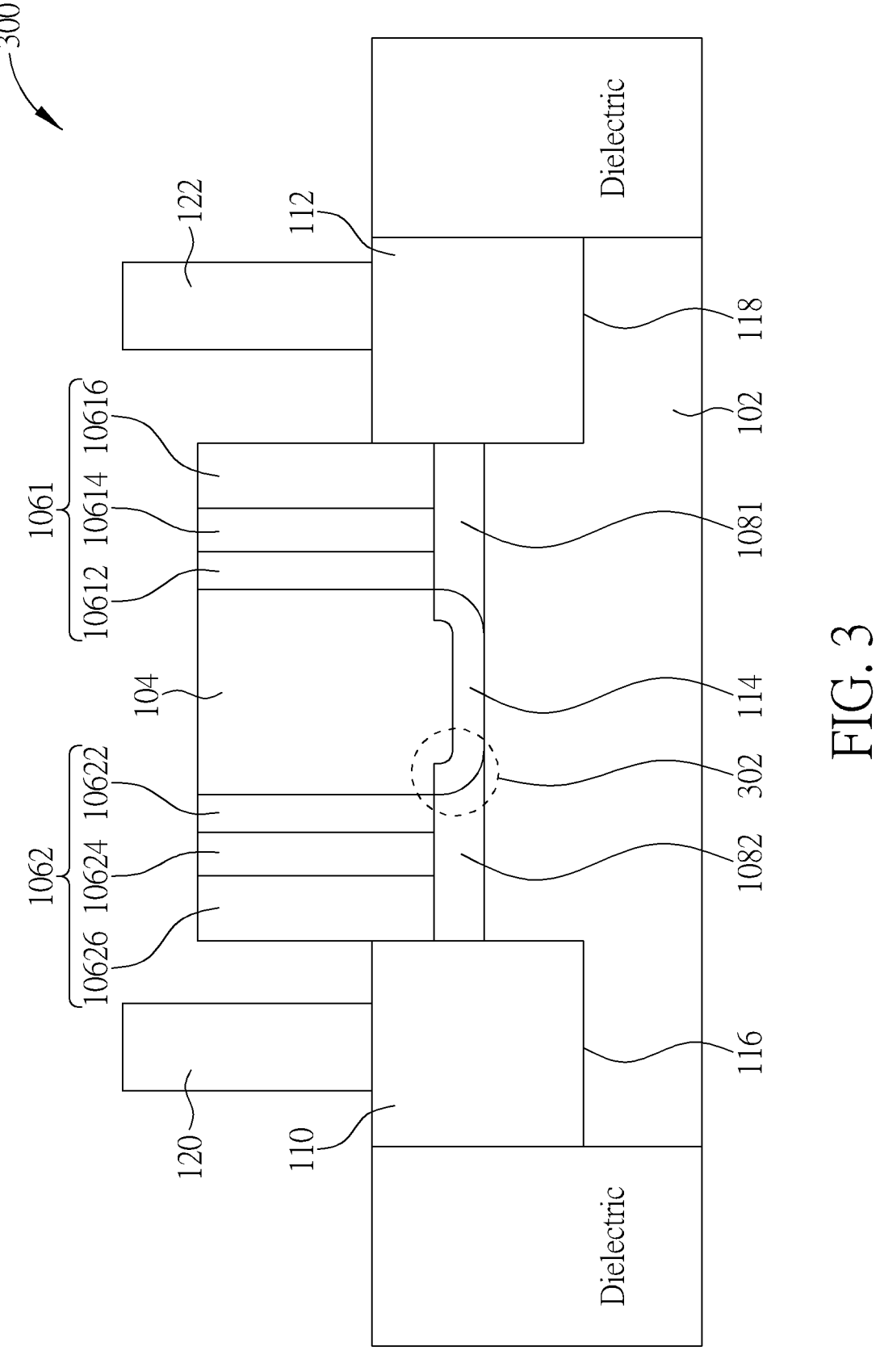
FIG. 3 is a diagram illustrating a cross section of a FinFET according to a third embodiment of the present invention.

Please refer to FIG. 3. FIG. 3 is a diagram illustrating a cross section of a FinFET 300 according to a third embodiment of the present invention, wherein differences between the FinFET 300 and the FinFET 100 are that the gate 104 has sidewalls directly coupled to the spacers 1061, 1062, and the gate dielectric layer 114 has a rounded shape 302 at edge sides in between the gate 104 and the spacers 1061, 1062, so the FinFET 300 is able to make a smaller length of the gate 104 than one of the FinFET 100, wherein an outer curvature radius of the rounded shape 302 is greater than a thickness of the gate dielectric layer 114. Of course, the FinFET 300 can also reduce the GIDL leakage current, SCE (short-channel effect), OFF current, or junction leakage current. In addition, in another embodiment of the present invention, the gate 104 only has a sidewall directly coupled to the spacer 1061 (or the spacer 1062). In addition, subsequent operational principles of the FinFET 300 can be referred to operational principles of the FinFET 100, so further description thereof is omitted for simplicity.

Figure 4:
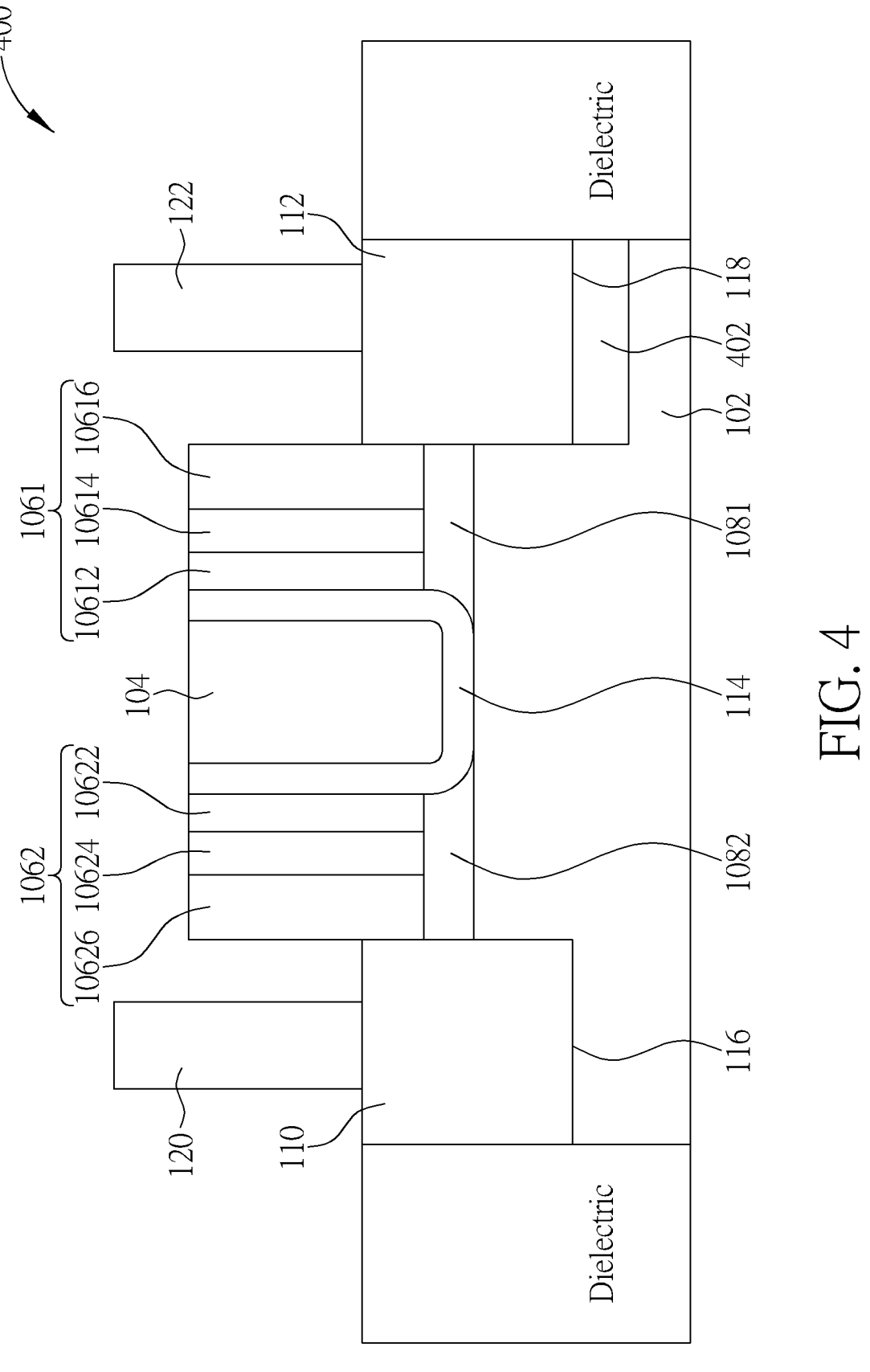
FIG. 4 is a diagram illustrating a cross section of a FinFET according to a fourth embodiment of the present invention.

Please refer to FIG. 4. FIG. 4 is a diagram illustrating a cross section of a FinFET 400 according to a fourth embodiment of the present invention, wherein differences between the FinFET 400 and the FinFET 100 are that a bottom of at least one concave of the first concave 116 and the second concave 118 is filled with an isolator (e.g. an insulation material), and an isolator-substrate junction exists between the isolator 402 and the substrate 102. For example, a bottom of the second concave 118 is filled with an isolator 402, and an isolator-substrate junction exists between the isolator 402 and the substrate 102. That is, compared to the source 110, the drain 112 not only has drain-substrate junction, but also has the isolator-substrate junction. Therefore, the FinFET 400 can further utilize the above-mentioned inconsistent condition of junctions of the source 110 and the drain 112 to reduce the junction capacitance, the GIDL leakage current, SCE (short-channel effect), OFF current, or junction leakage current while achieving the higher speed with lower AC switching power ($C*V^2*F$) dissipations. In addition, subsequent operational principles of the FinFET 400 can be referred to operational principles of the FinFET 100, so further description thereof is omitted for simplicity.

Figure 5:
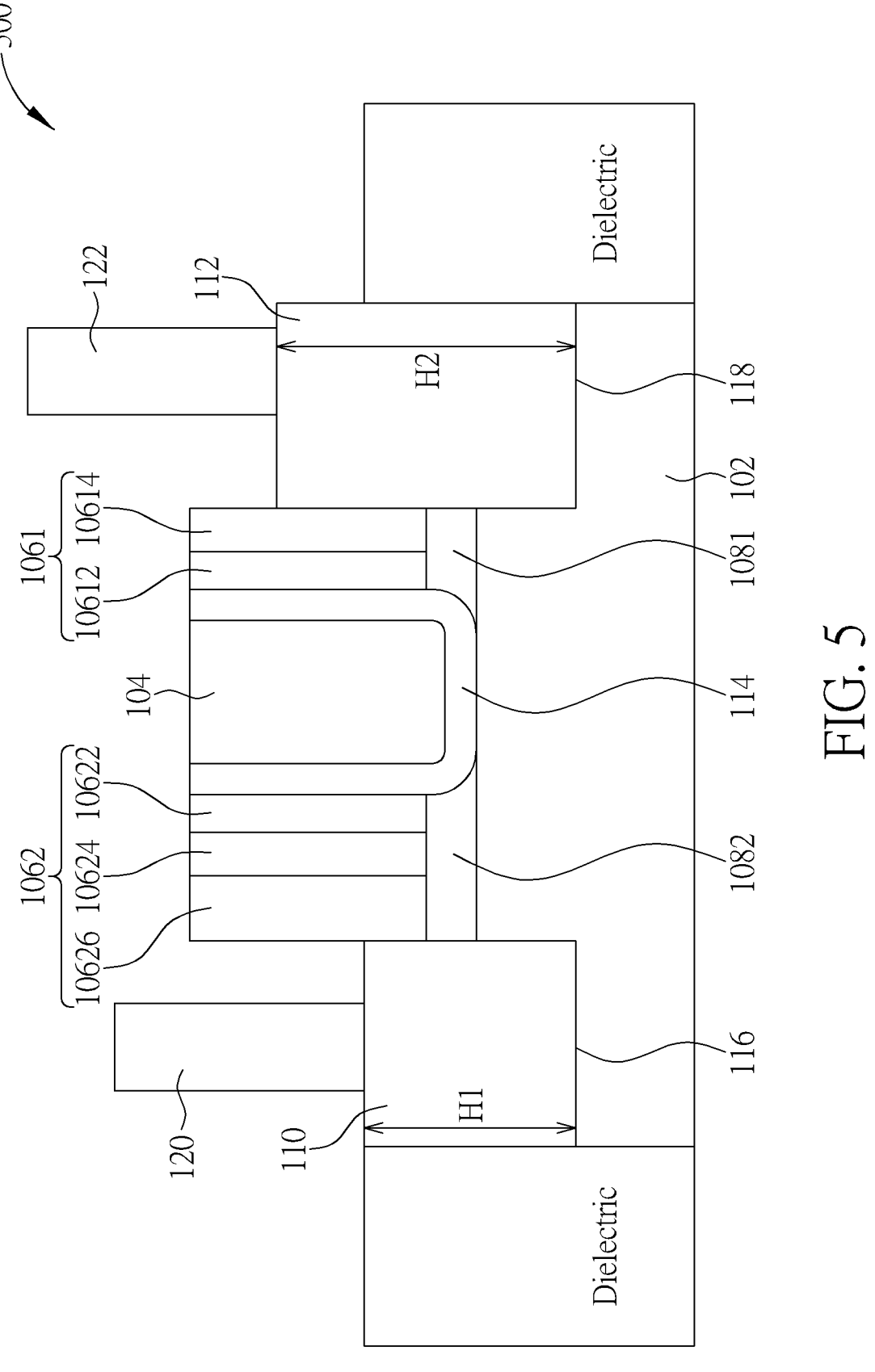
FIG. 5 is a diagram illustrating a cross section of a FinFET according to a fifth embodiment of the present invention.

Please refer to FIG. 5. FIG. 5 is a diagram illustrating a cross section of a FinFET 500 according to a fifth embodiment of the present invention, wherein a difference between the FinFET 500 and the FinFET 100 is that a thickness of at least one spacer of the spacers 1061, 1062 is controllable. For example, a thickness of the spacer 1061 is greater than a thickness of the spacer 1062. Therefore, the FinFET 500 can further utilize the above-mentioned inconsistent condition of thickness of the spacers 1061, 1062 to reduce the GIDL leakage current, SCE (short-channel effect), OFF current, or junction leakage current. In addition, in another embodiment of the present invention, not only the thickness of the at least one spacer of the spacers 1061, 1062 is controllable, but also a dimension (e.g. length, height) of at least one of the source 110 and the drain 112 is controllable. For example, height H1 of the source 110 is less than height H2 of the drain 112. Therefore, the FinFET 500 can further utilize the above-mentioned inconsistent conditions of thickness of the spacers 1061, 1062 and dimensions of the source 110 and the drain 112 to reduce the GIDL leakage current, SCE (short-channel effect), OFF current, or junction leakage current so as to achieve better speed with less leakage power dissipations. In addition, in another embodiment of the present invention, the dimension (e.g. length, height) of the at least one of the source 110 and the drain 112 is controllable. In addition, subsequent operational principles of the FinFET 500 can be referred to operational principles of the FinFET 100, so further description thereof is omitted for simplicity.

Figure 6:
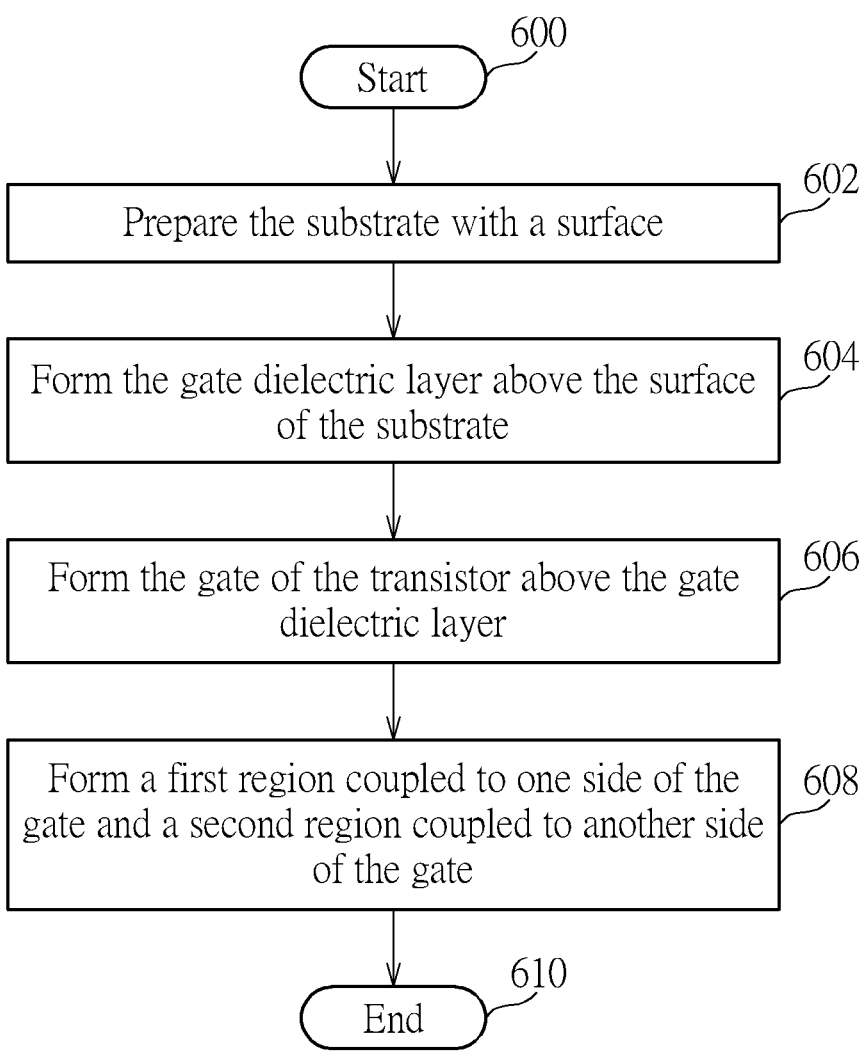
FIG. 6 is a flowchart illustrating a manufacturing method for a transistor according to a sixth embodiment of the present invention.

Please refer FIG. 6. FIG. 6 is a flowchart illustrating a manufacturing method for a transistor according to a sixth embodiment of the present invention. The manufacturing method in FIG. 6 is illustrated using the FinFET 200 in FIG. 2, the FinFET 400 in FIG. 4, and the FinFET 500 in FIG. 5. Detailed steps are as follows:

Step 600: Start.

Step 602: Prepare the substrate 102 with a surface.

Step 604: Form the gate dielectric layer 114 above the surface of the substrate 102.

Step 606: Form the gate 104 of the transistor above the gate dielectric layer 114.

Step 608: Form a first region coupled to one side of the gate and a second region coupled to another side of the gate.

Step 610: End.

In Step 608, taking the FinFET 200 as an example, as shown in FIG. 2, the first region includes the spacer 1062, the pad dielectric layer 1082, and the source 110 (i.e. the first conductive region) and the first region is coupled to one side of the gate 104; similarly, the second region includes the spacer 1061, the pad dielectric layer 1081, and the drain 112 (i.e. the second conductive region) and the second region is coupled to another side of the gate 104. In addition, by taking the controllable doping method including at least two or more different doping levels (i.e. doping recipes) during the source/drain formation periods of time, the first controllable doping concentration distribution includes the first doping concentration and the second doping concentration, and the first doping concentration corresponds to the first region 1102 of the source 110 and the second doping concentration corresponds to the second region 1104 of the source 110, so the distribution direction of the first controllable doping concentration distribution is vertical; the second controllable doping concentration distribution also includes the first doping concentration and the second doping concentration, and the first doping concentration corresponds to the third region 1124 of the drain 112 and the second doping concentration corresponds to the fourth region 1122 of the drain 112, so the distribution direction of the second controllable doping concentration distribution is horizontal. As shown in FIG. 2, because the distribution direction of the first controllable doping concentration distribution is vertical and the distribution direction of the second controllable doping concentration distribution is horizontal, the first region (including the source 110) and the second region (including the drain 112) are asymmetric.

In Step 608, taking the FinFET 400 as an example, as shown in FIG. 4, the bottom of the second concave 118 is filled with the isolator 402, and the isolator-substrate junction exists between the isolator 402 and the substrate 102. That is, compared to the source 110, the drain 112 not only has the drain-substrate junction, but also has the isolator-substrate junction. Because the bottom of the second concave 118 is filled with the isolator 402, the first region (including the source 110) and the second region (including the drain 112) are asymmetric.

In Step 608, taking the FinFET 500 as an example, as shown in FIG. 5, because the thickness of the spacer 1061 is greater than a thickness of the spacer 1062, and the height H1 of the source 110 is less than the height H2 of the drain 112, the first region (including the source 110 and the spacer 1062 (i.e. the first spacer)) and the second region (including the drain 112 and the spacer 1061 (i.e. the second spacer)) are asymmetric.

In addition, the FinFETs 100, 200, 300, 400, 500 can be used for Logic IC (Integrated Circuit) having embedded memory IP (intellectual property)/library circuits which include analog, DRAM (Dynamic Random Access Memory), HBM (High Bandwidth Memory), SRAM (Static Random Access Memory), Flash memory, MRAM (Magnetoresistive random-access memory), RRAM (Resistive random-access memory), CRAM (Chalcogenide random-access memory), PSRAM (Phase-change memory), ROM (Read-Only Memory), OPT (one time programmable memory), e-fuse, and the like.

In addition, the FinFETs 100, 200, 300, 400, 500 can also be used for Logic IC having embedded low power Logic IP/Lib, which include IO (input/output), ESD (Electrostatic Discharge), DDR (Double Data Rate) PHYs (Port Physical Layer), HBM (high-bandwidth memory) PHYs, MIPI (Mobile Industry Processor Interface), SerDes (Serializer/Deserializer), USB (Universal Serial Bus), high speed Interface, and the like.

In addition, the FinFETs 100, 200, 300, 400, 500 can also be used for Logic IC having embedded Analog IP/Lib circuits which include PLL (Phase-locked loop), DLL (delay-locked loop), RF (Radio frequency), High-V, Display drivers, Camera sendors, MEMS (Micro-Electro-Mechanical System), ultra-high speed (>10 to 100 GHz ranges), ultra-low power, ultra-low leakage, or Mix-mode, and the like.

In addition, the FinFETs 100, 200, 300, 400, 500 can also be used for Logic IC having 2D (two-dimensional), or 3D (three-dimensional) stacking dices for low power applications which include IoT (Internet of Things), 5G (fifth generation wireless systems), AI (Artificial Intelligence), Automotive, Autonomous drive, HPC (High Performance Computing) and Cloud computing, and the like applications.

To sum up, because the Fin Field-effect transistor (FinFET) that can utilize at least one of different dielectric layers, controllable doping concentrations of the source and the drain, different gate dielectric layers, different junctions of the source and the drain, different thickness of the source and the drain, and different dimensions of the source and the drain to reduce the GIDL leakage current, SCE (short-channel effect), OFF current, or junction leakage current, compared to the prior art, the present invention can reduce the GIDL leakage current, SCE (short-channel effect), OFF current, or junction leakage current more effectively while achieving the higher speed with lower AC switching power (C*V^2*F) dissipations.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A transistor, comprising:
a substrate with an original surface;
a gate formed above a gate dielectric layer, wherein the gate dielectric layer directly contacts to the substrate;
a first region coupled to one side of the gate, the first region comprising a first spacer, a first pad dielectric layer under the first spacer, and a first conductive region; and
a second region coupled to another side of the gate, the second region comprising a second spacer, a second pad dielectric layer under the second spacer, and a second conductive region, wherein the first pad dielectric layer is separated from the second pad dielectric layer by the gate dielectric layer;
wherein a first thickness of a first portion of the first pad dielectric layer close to the gate dielectric layer is less than a second thickness of a second portion of the first pad dielectric layer close to the first conductive region.

2. The transistor of claim 1, wherein a first thickness of a first portion of the second pad dielectric layer close to the gate dielectric layer is less than a second thickness of a second portion of the second pad dielectric layer close to the second conductive region.

3. The transistor of claim 2, wherein the first conductive region and the second conductive region are formed in a first concave of the substrate and a second concave of the substrate, respectively.

4. The transistor of claim 3, further comprising:
a first contact formed above the first conductive region; and
a second contact formed above the second conductive region;
wherein top surfaces of the first contact and the second contact are higher 5 nm to 400 nm than the top surface of the gate.

5. The transistor of claim 1, wherein the first region and the second region are asymmetric.

6. The transistor of claim 1, wherein the first conductive region at least extends downward from the original surface, and the second conductive region at least extends downward from the original surface.

* * * * *